United States Patent [19]

Baliga

[11] Patent Number: 5,392,187
[45] Date of Patent: Feb. 21, 1995

[54] INTEGRATED CIRCUIT POWER DEVICE WITH TRANSIENT RESPONSIVE CURRENT LIMITING MEANS

[75] Inventor: Bantval J. Baliga, Raleigh, N.C.

[73] Assignee: North Carolina State University at Raleigh, Raleigh, N.C.

[21] Appl. No.: 928,893

[22] Filed: Aug. 12, 1992

[51] Int. Cl.⁶ .............................................. H01L 27/02
[52] U.S. Cl. ...................................... 361/111; 361/91; 257/529
[58] Field of Search ...................... 361/111, 57, 93, 91; 257/529, 327, 379, 536, 533, 532; 307/465; 365/225.7

[56] References Cited

U.S. PATENT DOCUMENTS

| | | | |
|---|---|---|---|
| 4,742,425 | 5/1988 | Conzelmann et al. | 361/104 |
| 4,786,958 | 11/1988 | Bhagat | 357/38 |
| 4,942,308 | 7/1990 | Conzelmann et al. | 307/202.1 |
| 4,975,782 | 12/1990 | Bauer | 357/38 |
| 5,021,861 | 6/1991 | Baliga | 357/51 |
| 5,025,298 | 6/1991 | Fay et al. | 357/41 |
| 5,097,448 | 3/1992 | Segawa | 365/200 |
| 5,100,829 | 3/1992 | Fay et al. | 437/60 |

OTHER PUBLICATIONS

A Large Area MOS-GTO with Wafer-Repair Technique, M. Stoisiek et al., IEDM, 1987, pp. 666–669.
Modern Power Devices, B. Jayant Baliga, John Wiley & Sons, 1987, pp. 263–343.

Primary Examiner—A. D. Pellinen
Assistant Examiner—Sally Medley
Attorney, Agent, or Firm—Bell, Seltzer, Park & Gibson

[57] ABSTRACT

An integrated circuit power device includes many cell blocks which are electrically connected in parallel, with each of the cell blocks including at least one cell such as a MOSFET, electrically connected in parallel. A transient responsive current limiting means, such as a resistor/capacitor circuit, is electrically connected to each cell block, so that the leakage current into defective cell blocks is maintained below a predetermined level without limiting the operating speed of the device. An operable integrated circuit power device is thereby obtained, notwithstanding a defective cell block. The circuit resistors are preferably formed using the same mask and material as the gate. The circuit capacitors and common gate electrode are preferably formed using the same mask and material as the source electrode. The use of common materials eliminates the need for extra fabrication steps.

15 Claims, 4 Drawing Sheets

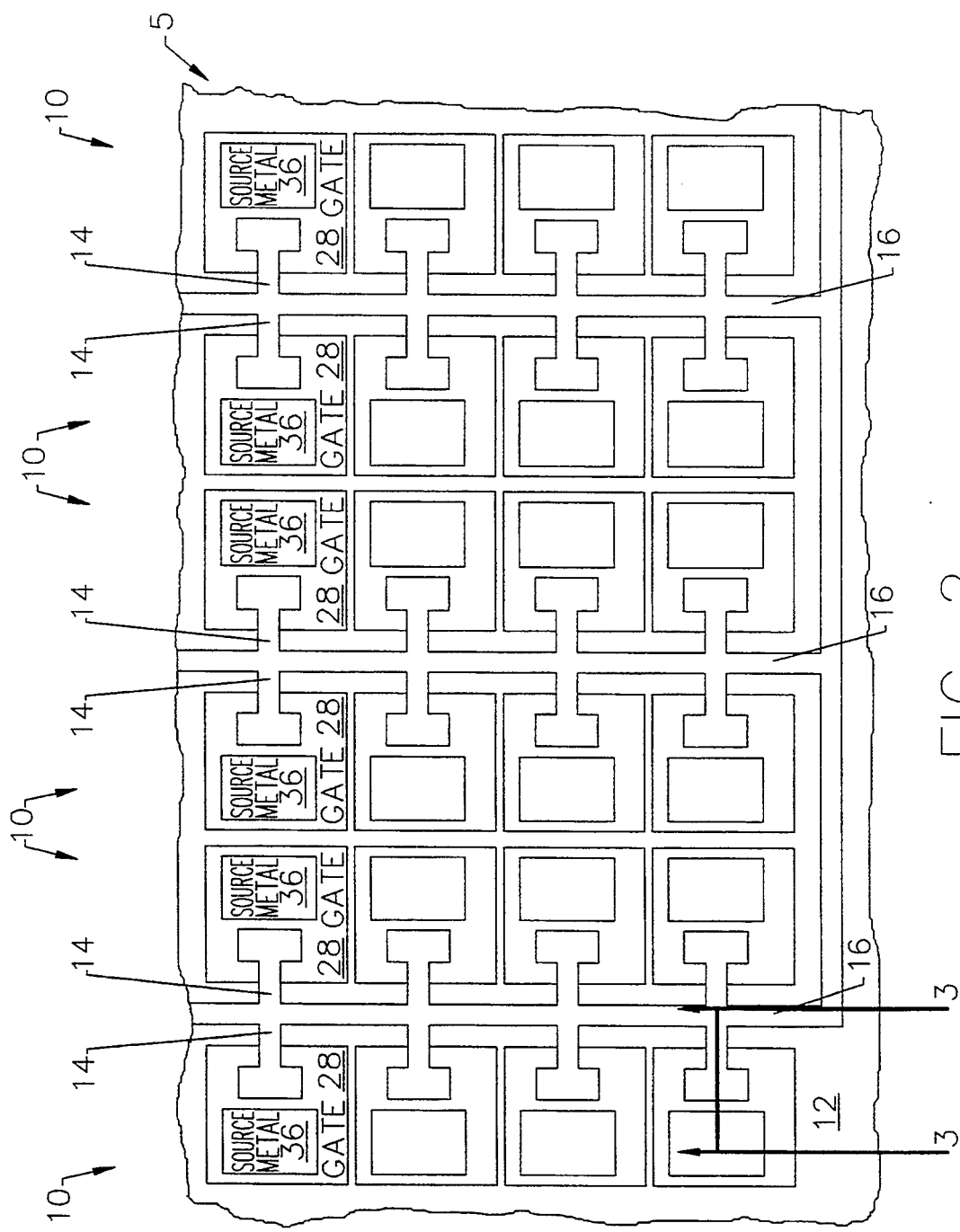

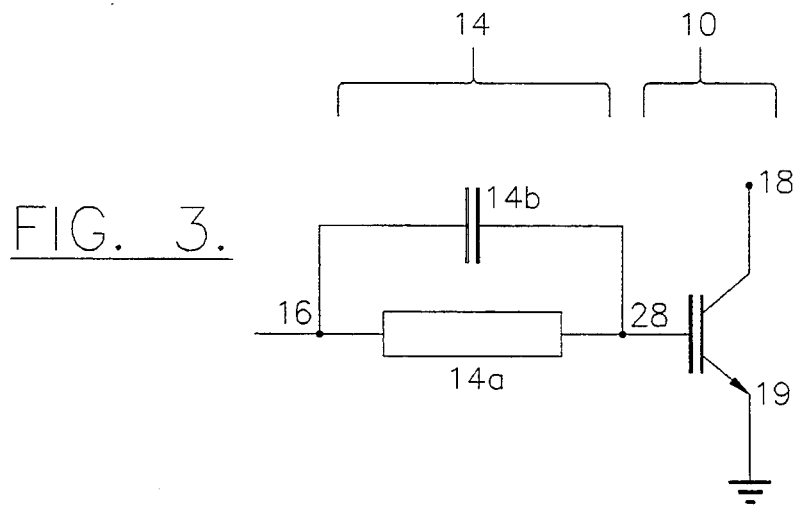
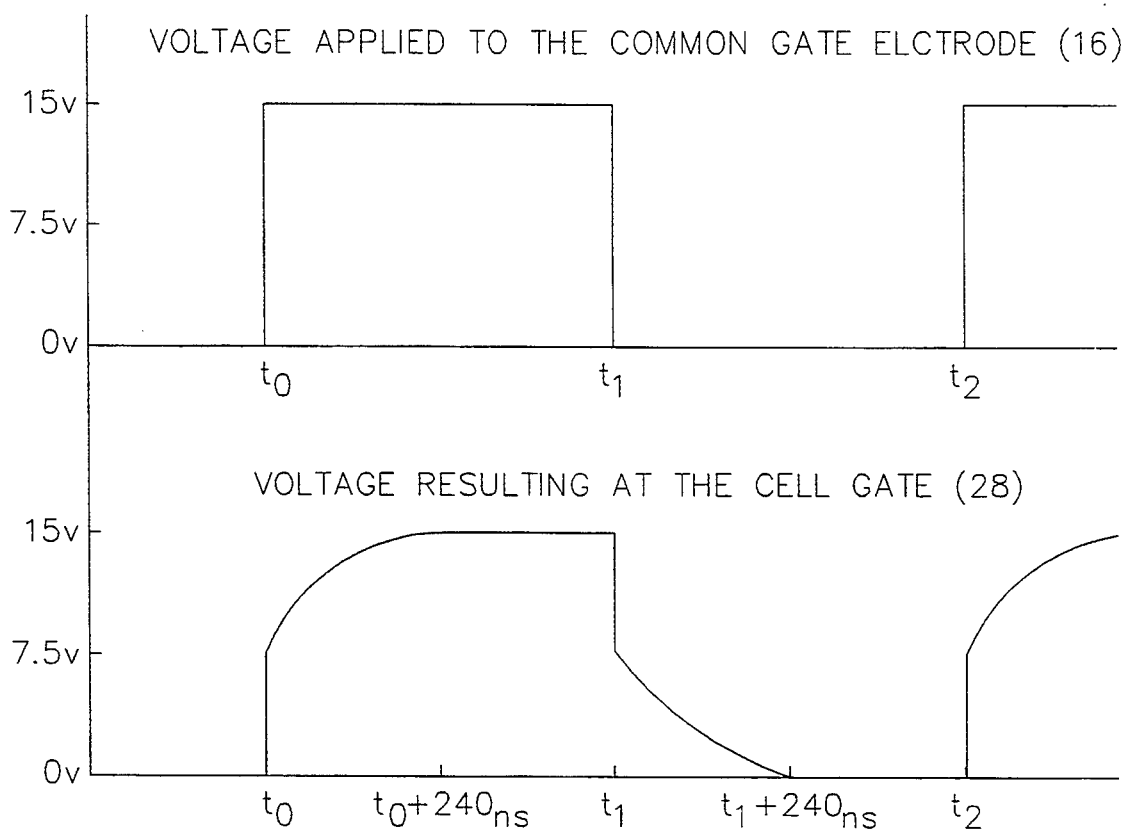

INTEGRATED CIRCUIT POWER DEVICE WITH TRANSIENT RESPONSIVE CURRENT LIMITING MEANS

FIELD OF THE INVENTION

This invention relates to semiconductor devices, and more particularly to integrated circuit semiconductor power devices.

BACKGROUND OF THE INVENTION

Power devices are widely used to carry large currents at high voltages. Since the early 1950's, developers of electronic power systems began to base their high power systems on semiconductor devices.

The power bipolar transistor was first developed in the early 1950's, and its technology has matured to a high degree, allowing the fabrication of devices with current handling capabilities of several hundred amperes and blocking voltages of 600 volts. However, despite the attractive power ratings achieved for bipolar transistors, there are several fundamental drawbacks in their operating characteristics. First, the bipolar transistor is a current-controlled device. A large base-drive current, typically one fifth to one tenth of the collector current, is required to maintain the power bipolar transistor in the on state. Even larger reverse base drive currents are necessary to obtain high speed turn-off. These characteristics make the base drive circuitry complex and expensive.

Bipolar transistors are also vulnerable to a second breakdown failure mode under the simultaneous application of a high current and high voltage to the device, as would commonly be required in inductive power circuits. It is also difficult to parallel bipolar power devices because the forward voltage drop in bipolar transistors decreases with increasing temperature. This decrease in forward voltage drop promotes diversion of the current to a single device which can lead to device failure.

The power Field Effect Transistor (FET) was developed to solve the performance limitations of power bipolar transistors. Power FETs are typically variants of the Insulated Gate FET (IGFET) or the Metal Insulator Semiconductor FET (MISFET). These device types are commonly referred to as Metal Oxide Semiconductor Field Effect Transistors (MOSFET) because they include a conducting gate electrode, typically metal, that is separated from a semiconductor surface by an intervening insulator, typically silicon dioxide. Accordingly, all field effect transistors which use a conducting gate electrode separated from a semiconductor surface by an intervening insulator will be referred to herein as MOSFETs.

The power MOSFET applies a control signal to the metal gate electrode that is separated from the semiconductor surface by an oxide. Accordingly, the control signal required is essentially a bias voltage, with no significant steady-state gate current flow in either the on-state or the off-state. Even when switching between these states, the gate current is small because it only serves to charge and discharge the input gate capacitance. The high input impedance is a primary feature of the power MOSFET that greatly simplifies the gate drive circuitry and reduces the cost of the power electronics.

Moreover, because current conduction in the MOSFET occurs through majority carrier transport only, no delays are observed as a result of storage or recombination of minority carriers in power MOSFETs during turn on. Their switching speed is therefore orders of magnitude faster than that of bipolar transistors. Power MOSFETs also possess an excellent safe operating area. That is, they can withstand the simultaneous application of high current and voltage for a short duration without undergoing destructive failure due to second breakdown. Power MOSFETs can also easily be paralleled, because the forward voltage drop of power MOSFETs increases with increasing temperature. This feature promotes an even current distribution in parallel devices.

In many present day power devices, large numbers of parallel-connected individual bipolar, MOS or other devices, commonly referred to as "cells", are fabricated in parallel in a single semiconductor integrated circuit, using well known microelectronic manufacturing techniques. Presently, up to 100,000 or more individual low current MOS-gated cells may be fabricated in parallel to produce a power device. The cells may be grouped in "cell blocks" each containing at least one cell and typically containing up to 1000 or more cells which are electrically connected in parallel. A power device may include up to 100 or more cell blocks, which are electrically connected in parallel between common source, drain and gate electrodes.

A major concern in fabricating a high current power device containing a large number of parallel cells is the yield of the resulting chip. In particular, it is difficult to provide a high yield high current power device in view of the defect rate of the individual cells on the semiconductor substrate. Since these individual cells are electrically connected in parallel, a short circuit in one cell renders the power device unusable. Accordingly, in practice, yields of only 30% are typically obtained even for relatively small chips with size of 0.25 inch by 0.25 inch.

One attempt at overcoming this yield problem is described in the article "A Large Area MOS-GTO with Wafer-repair Technique" by Stoisiek, et al., IEDM, 1987, pages 666–669. In this approach a MOS power device is fabricated out of about 300,000 individual MOS cells on a semiconductor substrate. The individual MOS cells are grouped into cell blocks, and each cell block is individually tested for faulty operation. The substrate is covered with an insulating layer, and a via hole pattern is etched into the insulating layer according to the results of the previous operational measurements, i.e. holes are etched only over the cell blocks without a fault. Consequently, the faulty cell blocks are insulated from the rest of the device. A metal layer connects all the operational cell blocks through the via holes. Thus, shorted cells are prevented from causing other cells to short circuit because they are not connected in parallel with the functional cells.

While the above described technique prevents a short circuit in one or more individual cell blocks from destroying the entire power device, this technique is not amenable to mass production of power devices. A custom mask must be designed for every wafer so that a via hole pattern may be etched on the insulating layer to connect only the fault-free cells or cell blocks. The cost of individual masks and the turn around time for designing the masks and then forming the individually designed via patterns makes the resultant devices prohibitively expensive. In addition, these operations increase the number of processing steps and add to overall fabrication cost for the large area device.

Another technique for overcoming the yield problem is described in U.S. Pat. No. 5,021,861 by the present inventor entitled *Integrated Circuit Power Device with Automatic Removal of Defective Devices and Method of Fabricating Same*. As described in the patent, defective cells are automatically disabled upon application of power to the power device without the need for testing of individual cells or customized mask generation. A fusible link formed of a low melting point conductor connects each cell block to the common electrode of the power device. For example, in a MOS-gated device, a fusible link connects the gate electrode of the power device to the common gate of each cell block. The fusible link is designed to melt in response to a defect related short circuit current in the associated cell block. Accordingly, when the device is initially powered, all fusible links associated with short circuited individual cells will melt, so that the cell block containing the defective cell is disconnected. See also U.S. Pat. Nos. 4,742,425 entitled *Multiple-Cell Transistor with Base and Emitter Fuse Links*, and 4,942,308 entitled *Power Transistor Monolithic Integrated Structure*, both to Conzelmann et al.

The above described technique eliminates the need to design and fabricate custom masks. Unfortunately, the minimum fusing current required to melt a fusible link is about ten milliamperes, and leakage currents below this value will not melt the fusible link. Conventional power devices possess gate leakage currents in the range of microamperes, about one thousand times less than the required fusing current. Accordingly, power devices including the automatic disabling fusible links have gate leakage currents which can be one thousand times the acceptable level.

Still another technique for overcoming the yield problem is described in the pending U.S. patent application, Ser. No. 07/895339, by the present inventor entitled *Integrated Circuit Power Device With External Disabling of Defective Devices And Method Of Fabricating Same*. As described in this patent application, defective cells are disabled during the testing process without the need for a customized mask. A fusible link connects each cell block to a common electrode of the power device. Furthermore, external measurement access means are formed in the integrated circuit allowing access to the fusible link from both the cell block and common electrode ends. For example, in a MOS-gated device, a fusible link connects the gate electrode of the power device to the common gate of each cell block, and individual test pads allow access to both ends of each fusible link. An external testing means is used to test each cell block for proper operation. An externally activated disabling means is used to disable nonfunctional cell blocks by disabling the fusible link with a high current.

The above described technique eliminates the need to design and fabricate custom masks, and there are no added fabrication steps. This technique allows the use of low resistance fuses for high speed operation. This technique also allows the external disabling means to disable cell blocks which have a leakage current above any specified level. However, the external testing of each cell block is a time consuming and costly process. Thus, the technique presents a tradeoff between leakage current and manufacturing time and cost. In view of the above, there is a need for an integrated circuit power device which maintains a low leakage current and allows high speed operation while eliminating the need to test each cell block individually.

SUMMARY OF THE INVENTION

It is therefore an object of the present invention to provide improved integrated circuit power devices.

It is another object of the present invention to provide an integrated circuit power device structure which obtains a high yield.

It is still another object of the present invention to provide a low cost integrated circuit power device structure.

It is yet another object of the present invention to provide an integrated circuit power device structure which produces low leakage current and high speed operation.

These and other objects are provided, according to the present invention, by forming a transient responsive current limiting means in the integrated circuit power device so that the leakage current into defective cell blocks is maintained below a predetermined level, and so that the device is capable of high speed operation. An operable integrated circuit power device is thereby obtained, notwithstanding a defective one or more individual cell blocks. Moreover, customized mask generation and external testing of each cell block are not necessary.

In a preferred embodiment of the present invention, the transient responsive current limiting means consists of a capacitor and a resistor, both formed in the integrated circuit. These elements are electrically connected in parallel, to link each individual cell block to the common gate electrode. The resistor acts as a current limiting means for maintaining the leakage current into defective cell blocks below a predetermined level. However, the resistor increases the time required to charge and discharge the gates in nondefective cell blocks. By including a capacitor in parallel with the resistor, the time required to charge and discharge the gates of nondefective cell blocks is reduced. The input circuit capacitor is electrically connected in series with the cell block gate capacitance creating an impedance dividing circuit. Therefore, changes in the externally applied gate electrode voltage are instantly divided between the input circuit capacitor and the cell block gate.

According to the invention, in a field effect transistor power device, a circuit consisting of a resistor and a capacitor in parallel connects a common electrode of the power device to the common gate of each cell block. The top electrode of the capacitor, the source electrode, and the common gate electrode may be formed of a common material; and the resistor and the cell block gates may be formed of a common material, thus eliminating extra processing steps.

The transient responsive current limiting means maintains the leakage current into defective cell blocks below a predetermined level without disabling the cell blocks, while also maintaining a sufficient operating speed. A separate mask for fabricating a special low current fuse is not necessary so the device fabrication process may be simplified. Furthermore, a separate test for each cell block is not required, and there is no need for customized masks.

BRIEF DESCRIPTION OF THE DRAWINGS

FIG. 2 is a top view of an integrated circuit power device embodying the present invention.

FIG. 3 is an equivalent circuit diagram of an integrated circuit power device embodying the present invention.

FIG. 4 is a waveform diagram demonstrating the relationship between the voltage applied to the common gate electrode and the voltage resulting at the individual cell block gates.

DESCRIPTION OF A PREFERRED EMBODIMENT

Figure 1:
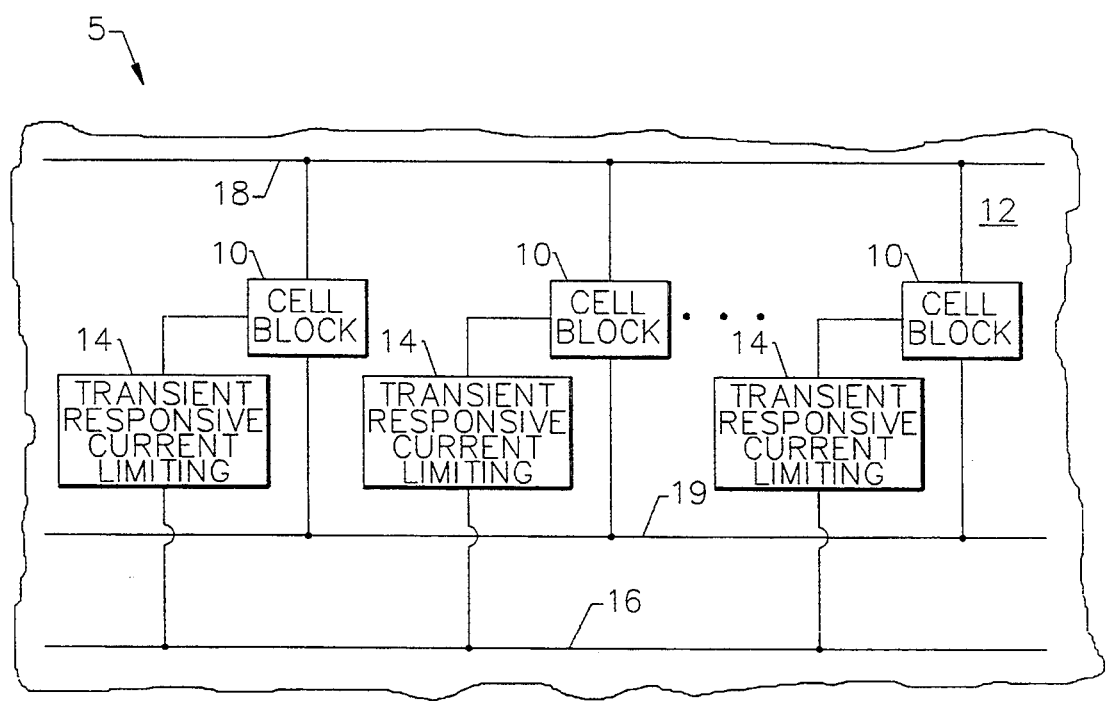
FIG. 1 is a schematic block diagram of an integrated circuit power device according to the present invention.

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. In the drawings, the thickness of layers and regions are exaggerated for clarity. Like numbers refer to like elements throughout. Referring now to FIG. 1, a schematic view of an integrated circuit power device 5 according to the present invention is shown. The integrated circuit power device 5 includes a large number of individual cell blocks be which are formed in a semiconductor substrate 12. Substrate 12 is typically monocrystalline silicon, but other semiconductor substrates may also be used. Each cell block 10 includes one or more cells or active devices. Typically up to one thousand or more cells or active devices are included in each cell block, although a cell block may include only one cell or active device. The cell blocks 10 are electrically connected in parallel between first common electrode 18 and second common electrode 19. A common control electrode 16 may also be provided. The individual cell blocks 10 may be one or more metal oxide semiconductor-gated devices (MOS-gated devices) such as MOS-gated transistors or insulated gate bipolar transistors (IGBT), or other devices which are electrically connected in parallel to form a power device. When MOS-gated devices are used, the firsty common electrode 18 is typically a source electrode, the second common electrode 19 is the drain electrode and the control electrode 16 is the common gate electrode. However, it will be understood that other devices will have other configurations.

According to the invention, each individual cell block 10 is electrically connected to the gate electrode 16 by transient responsive current limiting means 14.

In a preferred embodiment, the transient responsive current limiting means consists of a resistor (later identified as 14a) and capacitor (later identified as 14b) electrically connected in parallel. The resistor (14a) maintains the leakage current into defective cell blocks below a predetermined level. However, the resistor (14a) also increases the time required to charge the gates in nondefective cell blocks due to the RC time constant. The capacitor (14b) counteracts this delay by dividing the common gate electrode voltage between it and the cell block gate. In this manner, a portion of every voltage change on the common gate electrode is instantly transferred to nondefective cell block gates without the delay caused by the RC time constant.

Referring now to FIG. 2, a schematic top view of an integrated power MOSFET 5 according to the invention is shown. An array of cell blocks 1 are formed in semiconductor substrate 12. The top surface of the cell block 10 includes source metal region S1 which is connected to all of the individual cells in the cell block 10. All of the source metal regions 36 are also electrically connected together using a metal strap or other known means, not shown in FIG. 2. The top surface of the cell block 10 also includes a polysilicon gate region 28, to which the gates of the individual cells of the cell block 10 are connected. Polysilicon gate region 28 is connected to the gate electrode 16 via the transient responsive current limiting circuit 14.

It will be understood by those having skill in the art that the top surface of the device is typically encapsulated so that the internal layers thereof are unaccessible.

FIG. 3 illustrates an equivalent circuit of the transient responsive current limiting means of FIG. 2. The common gate electrode 16, the transient responsive current limiting means 14, and the gate 28 of the individual cell block 1 are electrically connected in series. The transient responsive current limiting means 14 consists of a resistor 14a and a capacitor 14b electrically connected in parallel. In a preferred embodiment, the resistor 14a is formed of polysilicon and has a value of 15 kohms. The resistance is determined by the geometry and the dopant concentration of this polysilicon area. With a 15 volt common gate electrode 16 bias, the leakage current into a defective cell block will be maintained below 1 milliampere.

FIG. 4 illustrates the voltage waveforms where the resistor 14a is 15 kohms, the cell block gate 28 input capacitance is 5.3 pF, the capacitor 14b is 5.3 pF, and the common gate electrode 16 is switched between 0 volts and 15 volts. As the waveforms in FIG. 4 demonstrate, when the voltage on the common gate electrode 16 rises from 0 volts to 15 volts, the voltage on the cell block gate 28 instantaneously rises from 0 volts to 7.5 volts. Then, the cell block gate 28 charges through the resistor 14a to 15 volts, the steady state condition, over a period of 240 nanoseconds. When the common gate electrode 16 falls from 15 volts to 0 volts, the process is reversed. The cell block gate 28 instantaneously falls from 15 volts to 7.5 volts with 240 nanoseconds required to discharge the remaining 7.5 volts.

Figure 5:
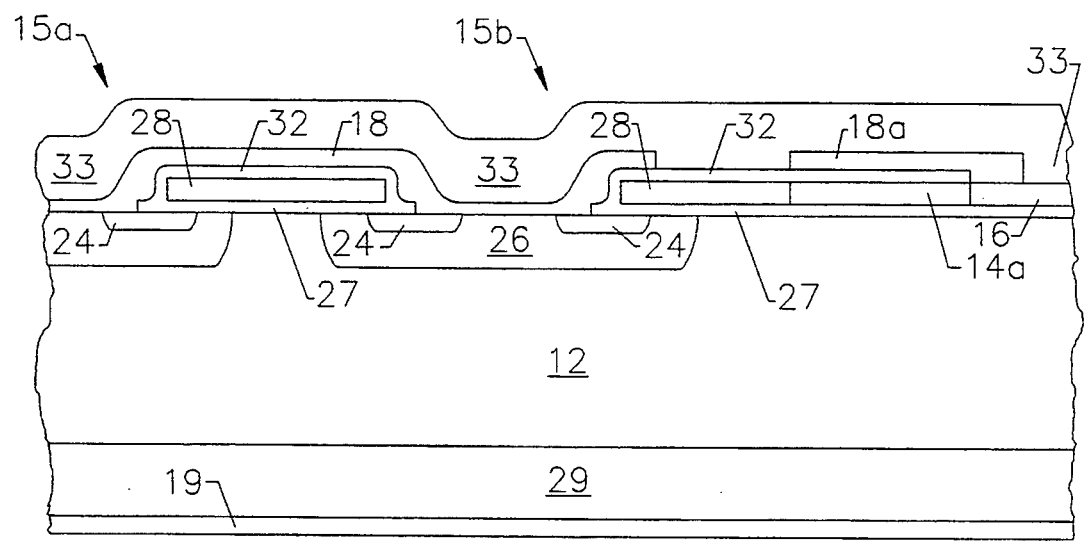
FIG. 5 is a detailed cross-sectional view taken along line 3—3 of FIG. 2.

FIG. 5 illustrates a detailed crosssectional view taken along line 3—3 of FIG. 2. As shown in FIG. 5, two individual cells 15a and 15b are shown in semiconductor substrate 12. These cells 15a and 15b represent two adjacent cells at the end of cell block 10 as indicated by line 3—3 in FIG. 2. Cells 15a and 15b are in the form of metal oxide semiconductor field effect transistors (MOSFETs). The source 24 is typically doped n+ and the base region 26 is typically a p-type doped region and driven deeper than the n+ source 24. The difference in lateral diffusion between the p-type base region 21 and the n+ source region 24 defines a surface channel region. An oxide layer 27, typically 0.1 μm thick, is formed on the substrate 12 by thermal oxidation or other well known techniques. A polysilicon gate 28 is formed on oxide 27, and is doped n-type at a high concentration. The circuit resistor 14a is formed of the same polysilicon layer used to form the gate 28. The value of resistor 14a is determined by its geometric design and the dopant concentration. The drain 29 appears at the opposite face of the substrate 12 from the source 24. A drain electrode 19 is fabricated on the bottom face of the semiconductor substrate 12 to connect all drains together. The structure and fabrication steps for power devices 15 are described in the textbook entitled *Modern Power Devices* by the present inventor, published in 1987 by John Wiley and Sons, the disclosure of which is hereby incorporated herein by reference.

After the individual cells 15 are formed in the semiconductor substrate 12, an oxide layer 32 is formed on the polysilicon gate 28 as seen in FIG. 3. The oxide layer 32 may be approximately 1 μm thick and may be formed by deposition or other conventional techniques. A metal layer 18, for example aluminum, is evaporated or deposited on oxide layer 32. Thus, the sources 24 are connected to metal layer 18. The metal layer 18 serves as a common source electrode for all individual cells 15 in all cell blocks 10. Portion 18a of layer 18 serves as the top electrode of capacitor 14b, with the capacitor dielectric being layer 32 and the bottom electrode being layer 14a. Common gate electrode 6 and top electrode 18a of circuit capacitor 14b are also formed on oxide layer 27, preferably simultaneously with source metal layer 18.

As shown in FIG. 5, common gate electrode 16, top electrode 18a of capacitor 14b, and source metal layer 18 are formed in a single masking step, using a common material. Also, input circuit resistor 14a and polysilicon gate 28 are formed in the same masking step, using a common material. As an example, a cell block gate structure consisting of a segment 25 microns by 1250 microns on a thin silicon dioxide layer could have an input capacitance of 5.3 pF. By forming a 65 micron wide metal region overlapping the polysilicon and separating the two by a thin silicon dioxide layer, a 5.3 pF input capacitor can be obtained. The use of common materials reduces the number of fabrication steps. If a lower dopant concentration is required to form circuit resistor 14a, an added dopant step will be required.

The present invention includes a number of advantages compared to known techniques for automatically disabling defective cell blocks and known techniques for manually disabling cell blocks by custom designing a mask. In particular, there is no need to make a custom mask for each device, and there is no need to test each cell block individually. Accordingly, devices with leakage currents on the order of a milliampere may be produced with switching delays of only 240 ns.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A power device comprising:
an integrated circuit;
a plurality of cell blocks formed in said integrated circuit and electrically connected in parallel, each of said cell blocks including at least one cell electrically connected in parallel, each cell block handling a relatively small current so that said plurality of cell blocks electrically connected in parallel handle a relatively large current, at least one of said cell blocks being a defective cell block; and
a plurality of circuits each circuit comprising at least one resistor and at least one capacitor formed in said integrated circuit and electrically connected to said cell blocks.

2. The power device of claim 1 wherein said circuit comprising at least one resistor and at least one capacitor comprises a resistor and a capacitor connected in parallel.

3. The power device of claim 1 further comprising a common electrode in said integrated circuit, and wherein said plurality of circuits each circuit comprising at least one resistor and at least one capacitor are electrically connected between said common electrode and a respective one of said cell blocks.

4. The power device of claim 3 wherein at least one said cell block comprises a plurality of field effect transistors, each having a source, a drain and a gate, the sources of said field effect transistors being connected together, the drains of said field effect transistors being connected together and the gates of said field effect transistors being connected together; wherein said common electrode comprises a common gate electrode; and wherein said plurality of circuits each circuit comprising at least one resistor and at least one capacitor are connected between said common gate electrode and the gates of the field effect transistors in a respective cell block.

5. The power device of claim 3 wherein said common electrode is formed of a predetermined material in said integrated circuit and wherein said resistors are formed of said predetermined material in said integrated circuit.

6. The power device of claim 3 wherein said common source connection of said cell block is formed of a predetermined material in said integrated circuit and wherein said capacitors each include at least one electrode which is formed of said predetermined material in said integrated circuit.

7. The power device of claim 3 wherein said cell block includes a predetermined input capacitance and wherein said capacitor is equal to said predetermined input capacitance.

8. A power device comprising:
an integrated circuit;
a plurality of cell blocks formed in said integrated circuit and electrically connected in parallel, each of said cell blocks including at least one cell electrically connected in parallel, each cell handling a relatively small current so that said plurality of cell blocks electrically connected in parallel handle a relatively large current, at least one of said cell blocks being a defective cell block; and
a plurality of resistors formed in said integrated circuit, electrically connected to a respective one of said cell blocks, for limiting the leakage current into said cell blocks including said defective cell block without disabling said cell blocks;
whereby the input leakage current into defective cell blocks is limited without disabling said defective cell blocks, to provide an operable integrated circuit power device notwithstanding defective cell blocks therein.

9. The power device of claim 8 further comprising a common electrode in said integrated circuit, and wherein said plurality of resistors are electrically connected between said common electrode and a respective one of said cell blocks.

10. The power device of claim 9 wherein each of said cell blocks comprises a plurality of field effect transistors, each having a source, a drain and a gate, the sources of said field effect transistors being connected together, the drains of said field effect transistors being connected together and the gates of said field effect transistors being connected together; wherein said common electrode comprises a common gate electrode; and wherein said plurality of resistors are connected between said common gate electrode and the gates of the field effect transistors in a respective cell block.

11. The power device of claim 10 wherein said common electrode is formed of a predetermined material in said integrated circuit and wherein said resistors are formed of said predetermined material in said integrated circuit.

12. A power device comprising:
an integrated circuit;
a plurality of cell blocks formed in said integrated circuit and electrically connected in parallel, each of said cell blocks including at least one cell electrically connected in parallel, each cell handling a relatively small current so that said plurality of cell blocks electrically connected in parallel handle a relatively large current, at least one of said cell blocks being a defective cell block; and
a plurality of capacitors formed in said integrated circuit a respective one of which is electrically connected to a respective one of said cell blocks, for passing voltage changes to the respective cell block without short circuiting the respective cell block; to provide an operable integrated circuit power device notwithstanding defective cell blocks therein.

13. The power device of claim 12 further comprising a common electrode in said integrated circuit, and wherein said plurality of capacitors are electrically connected between said common electrode and a respective one of said cell blocks.

14. The power device of claim 13 wherein said at least one cell comprises a plurality of field effect transistors, each having a source, a drain and a gate, the sources of said field effect transistors being connected together, the drains of said field effect transistors being connected together and the gates of said field effect transistors being connected together; wherein said common electrode comprises a common gate electrode; and wherein said plurality of capacitors are connected between said common gate electrode and the gates of the field effect transistors in a respective cell block.

15. The power device of claim 14 wherein said common source connection of said cell block is formed of a predetermined material in said integrated circuit wherein capacitors each include at least one electrode which is formed of said predetermined material in said integrated circuit.

* * * * *

UNITED STATES PATENT AND TRADEMARK OFFICE
CERTIFICATE OF CORRECTION

PATENT NO. : 5,392,187
DATED : February 21, 1995
INVENTOR(S) : Bantval J. Baliga It is certified that error appears in the above-identified patent and that said Letters Patent is hereby corrected as shown below:

Column 5, line 51, "firsty" should be --first--.

Column 6, line 10, "S1" should be --36--.

Column 6, line 62, "21" should be --26--.

Column 7, line 25, "6" should be --16--.

Signed and Sealed this

Twelfth Day of December, 1995

Attest:

BRUCE LEHMAN

*Attesting Officer*     *Commissioner of Patents and Trademarks*